(12) United States Patent
Nakayama et al.

(10) Patent No.: US 8,003,976 B2
(45) Date of Patent: Aug. 23, 2011

(54) ORGANIC LIGHT-LIGHT CONVERSION DEVICE

(75) Inventors: Kenichi Nakayama, Ibaraki (JP);
Masaaki Yokoyama, Nishinomiya (JP);
Masato Ueda, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 197 days.

(21) Appl. No.: 10/582,398

(22) PCT Filed: Dec. 16, 2004

(86) PCT No.: PCT/JP2004/018803
§ 371 (c)(1),
(2), (4) Date: Sep. 5, 2006

(87) PCT Pub. No.: WO2005/060012
PCT Pub. Date: Jun. 30, 2005

(65) Prior Publication Data
US 2007/0051945 A1    Mar. 8, 2007

(30) Foreign Application Priority Data
Dec. 17, 2003   (JP) ................................. 2003-419415

(51) Int. Cl.
*H01L 29/08* (2006.01)
(52) U.S. Cl. ............. 257/40; 257/13; 257/79; 257/103; 257/642; 257/759; 257/E51.001; 257/E51.052; 257/E25.008; 257/E25.009
(58) Field of Classification Search .................. 257/79, 257/40, 642, 643, 13, 103, E51.001, E51.052, 257/E25.008, E25.009
See application file for complete search history.

(56) References Cited

U.S. PATENT DOCUMENTS

| | | | |
|---|---|---|---|
| 5,555,205 A * | 9/1996 | Okabe ........................... | 365/108 |
| 6,930,658 B2 * | 8/2005 | Lee et al. ......................... | 345/77 |
| 6,966,997 B1 * | 11/2005 | Inganas et al. .................. | 216/36 |
| 7,026,654 B2 * | 4/2006 | Igaki et al. ....................... | 257/80 |
| 2003/0048239 A1 * | 3/2003 | Cok et al. ........................ | 345/55 |
| 2003/0122749 A1 * | 7/2003 | Booth et al. .................... | 345/82 |

(Continued)

FOREIGN PATENT DOCUMENTS

EP      0 725 120       8/1996

(Continued)

OTHER PUBLICATIONS

N.S. Sariciftci et al., Semiconducting polymer-buckminsterfullerene heterojunctions: Diodes, photodiodes, and photovoltaic cells, Applied Physics Letters, vol. 62, No. 6, 1993, pp. 585-587.

(Continued)

*Primary Examiner* — Wael M Fahmy
*Assistant Examiner* — Marc Armand
(74) *Attorney, Agent, or Firm* — Sughrue Mion, PLLC

(57) ABSTRACT

An organic light-light conversion device excellent in device characteristics, comprising a light sensing unit having a layer including a photo-conductive organic semiconductor developing a photo-current multiplication phenomenon by light irradiation, and a light emitting unit having a layer including an electroluminescent organic semiconductor emitting light by current injection, characterized in that at least one of the photo-conductive organic semiconductor and an electroluminescent organic semiconductor is polymer semiconductor. An imaging intensifier consisting of a plurality of arranged above organic light-light conversion devices. An optical sensor provided with a means of measuring and outputting voltages applied to the above organic light-light conversion device and to the opposite ends of a layer including the electroluminescent organic semiconductor.

18 Claims, 3 Drawing Sheets

U.S. PATENT DOCUMENTS

| | | | |
|---|---|---|---|
| 2003/0173507 A1* | 9/2003 | Paritsky et al. | 250/227.14 |
| 2003/0189213 A1 | 10/2003 | Igaki et al. | |
| 2004/0031966 A1* | 2/2004 | Forrest et al. | 257/79 |
| 2005/0067949 A1* | 3/2005 | Natarajan et al. | 313/504 |
| 2005/0088079 A1* | 4/2005 | Daniels | 313/504 |
| 2006/0098203 A1* | 5/2006 | Kalveram | 356/446 |

FOREIGN PATENT DOCUMENTS

| | | |
|---|---|---|
| JP | 58-93293 A | 6/1983 |
| JP | 63-88872 A | 4/1988 |
| JP | 9-45478 A | 2/1997 |
| JP | 9-74238 A | 3/1997 |
| JP | 9-508504 A | 8/1997 |
| JP | 11-329736 A | 11/1999 |
| JP | 2002190616 | 7/2002 |
| JP | 2002-341395 A | 11/2002 |
| JP | 2003-101060 A | 4/2003 |
| JP | 2003-282934 A | 10/2003 |
| JP | 2004-022908 A | 1/2004 |
| JP | 4170026 | 8/2008 |
| WO | 02/50920 A1 | 6/2002 |
| WO | WO 02/50920 A1 | 6/2002 |

OTHER PUBLICATIONS

Yoshihiro Nishikawa et al., "Coplanar-Gata Yukiko-Hikari Henkan Device", Dai 49 Kai Oyo Butsuri Gakkai Rengo Koenkai Koen Yokoshu, 2002, 28p-M-10.

Masahiro Hiramoto et al., Photocurrent multiplication in organic pigment films, Applied Physics Letters, vol. 64, No. 2, 1994, pp. 187-189.

Akihiro Hiramoto et al., "Yu8ki Tasomaku Kozo o Motsu Hikari Zofuku Device", Oyo Bu8tsuri, vol. 64, No. 10, 1995, pp. 1036-1039.

K. Nakayama, et al., "Organic co-planar-type photo-sensor/LED coupled device", Japan Hardcopy Fall Meeting, 2002, pp. 77-80, Abstract.

* cited by examiner

ORGANIC LIGHT-LIGHT CONVERSION DEVICE

TECHNICAL FIELD

The present invention relates to an organic light-light conversion device.

BACKGROUND ART

It has been known that a phenomenon wherein a photo-current generated by a larger number of electrons than the number of incident photons is observed (photo-current multiplication phenomenon) when a layer composed of a photo-conductive organic semiconductor is contacted to a conductive layer composed of a material different from the photo-conductive organic semiconductor (such as a metal, an organic semiconductor and an inorganic semiconductor) (heterogeneous material conductive layer), and the layer composed of a photo-conductive organic semiconductor is irradiated by light while applying a voltage (refer to Non-Patent Document 1 and Patent Document 1).

This is a phenomenon wherein the electric charge of one in electron-hole pairs formed by light irradiation (e.g. holes) is accumulated in a photo-conductive organic semiconductor in the vicinity of the boundary between the layer composed of the photo-conductive organic semiconductor and the heterogeneous material conductive layer by light irradiation, and a large amount of charge (e.g. electrons) having a polarity opposite to the accumulated charge is injected by tunneling from the heterogeneous material conductive layer into the photo-conductive organic semiconductor by the high electric field formed by the charge. An element having a combination of a layer composed of a photo-conductive organic semiconductor and a heterogeneous material conductive layer using such a phenomenon is herein referred to as a photo-current multiplication element.

As a device to which a photo-current multiplication element is applied, there has been known an organic light-light conversion device having:

a light sensing unit having a layer including a photo-conductive organic semiconductor that causes a photo-current multiplication phenomenon by light irradiation (photo-current multiplication layer); and a light emitting unit having a layer including an electroluminescent organic semiconductor that emits light by current injection (organic EL light emitting layer).

In such a device, although light is emitted from the light emitting unit by radiating light to the light sensing unit, the light is amplified by radiated light, and the wavelength thereof can be the same as or different from the wavelength of the radiated light.

As examples of such organic light-light conversion devices, there has been known:

a device wherein a light sensing unit having a layer including a photo-conductive organic semiconductor and a light emitting unit having a layer including an electroluminescent organic semiconductor are integrally laminated on the same substrate (Non-Patent Document 2); and a device wherein a light sensing unit having a layer including a photo-conductive organic semiconductor and a light emitting unit having a layer including the above-described organic electroluminescent body placed on a location different from the location of the light sensing unit on the same substrate (Non-Patent Document 3).

Both the photo-conductive organic semiconductor and the electroluminescent organic semiconductor used in the photo-current multiplication layer and an organic EL light emitting layer in these devices were low-molecular-weight compound, such as organic pigments, and these were used alone or by dispersing in a resin in these layers.

Patent Document 1: JP-A-2002-341395

Non-Patent Document 1: M. Hiramoto, T. Imahigashi and M. Yokoyama: Applied Physics Letters, Vol. 64, 187 (1994)

Non-Patent Document 2: "Applied Physics", Vol. 64 (1995), 1036

Non-Patent Document 3: 49th Lecture Meeting of Japan Society of Applied Physics, 28p-M-10

DISCLOSURE OF THE INVENTION

Problem to be Solved by the Invention

The above-described organic light-light conversion device using a low-molecular-weight compound as a photo-conductive organic semiconductor and an electroluminescent organic semiconductor had problems wherein short-circuiting occurred easily because pinholes were easily produced in the photo-current multiplication layer and the organic EL light emitting layer, and when a resin containing a dispersed low-molecular-weight compound was used, the low-molecular-weight compound aggregated easily; and in any case, the device characteristics were still insufficient.

It is an object of the present invention to provide an organic light-light conversion device that excels in device characteristics.

Means to Solve the Problem

As a result of extensive studies to solve the above-described problems, the present inventors have found that an organic light-light conversion device that excels in device characteristics can be obtained by substituting at least one of a photo-conductive organic semiconductor and an electroluminescent organic semiconductor by a polymer semiconductor, and completed the present invention.

(1) An organic light-light conversion device comprising:

a light sensing unit having a layer including a photo-conductive organic semiconductor that causes a photo-current multiplication phenomenon by light irradiation, and a light emitting unit having a layer including an electroluminescent organic semiconductor that emits light by current injection, characterized in that at least one of the photo-conductive organic semiconductor and the electroluminescent organic semiconductor is a polymer semiconductor.

(2) The organic light-light conversion device described in (1), wherein the photo-conductive organic semiconductor is a polymer semiconductor.

(3) The organic light-light conversion device described in (1), wherein the electroluminescent organic semiconductor is a polymer semiconductor.

(4) The organic light-light conversion device described in any one of (1) to (3), wherein the photo-conductive organic semiconductor and the electroluminescent organic semiconductor are polymer semiconductors.

(5) The organic light-light conversion device described in any one of (1) to (4), comprising:
  a) a light sensing unit having a layer including the photo-conductive organic semiconductor,
  b) a light emitting unit having a layer including the electroluminescent organic semiconductor placed on a different location from the light sensing unit on the same substrate, and
  c) a conductive layer connecting the light sensing unit to the light emitting unit laid on the same substrate.
(6) The organic light-light conversion device described in (5), wherein a light shielding member is provided between the light sensing unit and light emitting unit.
(7) The organic light-light conversion device described in (5), wherein a translucent member having a transmittance that suppresses but does not completely shield the flow of feedback light into the light sensing unit is provided between the light sensing unit and the light emitting unit.
(8) The organic light-light conversion device described in any one of (1) to (4), wherein the light sensing unit having a layer including a photo-conductive organic semiconductor is integrally laminated with the light emitting unit having a layer including the electroluminescent organic semiconductor.
(9) The organic light-light conversion device described in any one of (1) to (8), wherein the polymer semiconductor contains one or more repeating units represented by the following Formula (1):

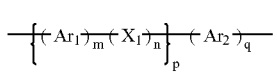

wherein $Ar_1$ and $Ar_2$ each independently represent an arylene group or a divalent heterocyclic group; $X_1$ represents —$CR_1$=$CR_2$—, —C≡C— or —N($R_3$)—; $R_1$ and $R_2$ each independently represent a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group; m, n and q each independently represent an integer of 0 or 1; p represents an integer of 0 to 2; and m+n and p+q are each 1 or more, provided that $Ar_1$, $X_1$, $R_1$, $R_2$ and $R_3$, if they are each multiple, can be respectively identical or different, and has a polystyrene-converted number average molecular weight of $1 \times 10^3$ to $1 \times 10^8$.
(10) The organic light-light conversion device described in any one of (1) to (9), wherein the layer including the photo-conductive organic semiconductor and/or the layer including the electroluminescent organic semiconductor contains two or more polymer semiconductors containing one or more repeating units represented by Formula (1).
(11) An image intensifier characterized by comprising a plurality of the organic light-light conversion devices described in any one of (1) to (10) arranged.
(12) A light sensor characterized by comprising the organic light-light conversion device described in any one of (1) to (10), and a means to measure and output a voltage applied to both ends of the layer including the electroluminescent organic semiconductor.

Advantages of the Invention

The organic light-light conversion device of the present invention excels in device characteristics, such as light-light conversion efficiency.

BEST MODE FOR CARRYING OUT THE INVENTION

Figure 1:
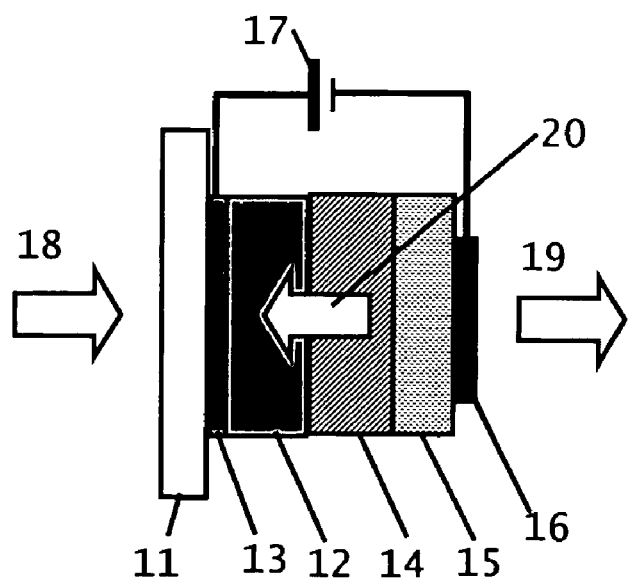
FIG. 1 is a sectional view showing a configuration example of a light-light conversion device of the present invention.

The organic light-light conversion device of the present invention is an organic light-light conversion device comprising:
  a light sensing unit having a layer including a photo-conductive organic semiconductor causing a photo-current multiplication phenomenon by light irradiation, and
  a light emitting unit having a layer including an electroluminescent organic semiconductor emitting light by current injection, characterized in that
  at least one of the photo-conductive organic semiconductor and the electroluminescent organic semiconductor is a polymer semiconductor.

An embodiment of an organic light-light conversion device of the present invention is:
(A) an organic light-light conversion device including a light sensing unit having a layer including a photo-conductive organic semiconductor, and a light emitting unit having a layer including the above-described electroluminescent organic semiconductor placed on the location different from the light sensing unit on the same substrate, wherein at least one of the photo-conductive organic semiconductor and the electroluminescent organic semiconductor is a polymer semiconductor.

In this case, the light sensing unit is electrically connected to the light emitting unit through a conductive layer laid on the same substrate. The conductive layer laid on the substrate can cover the entire surface of the substrate, or can have a minimal size required for electrically connecting the light sensing unit to the light emitting unit.

In order to apply a voltage between the light sensing unit and the light emitting unit, an electrode is installed on the surface opposite to the substrate side of the light sensing unit and/or the light emitting unit. In order to cause a photo-current multiplication phenomenon, an electrically conductive layer composed of a material different from the photo-conductive organic semiconductor (referred to as a "heterogeneous material conductive layer") contacting the layer composed of the photo-conductive organic semiconductor is installed in the light sensing unit.

Here, as the material used in the heterogeneous material conductive layer can be selected from materials having conductivity that can supply a large amount of polar charge injected by tunneling into the photo-conductive organic semiconductor by the photo-current multiplication phenomenon, and can easily cause the photo-current multiplication phenomenon. Examples of such materials include metals, organic semiconductors or inorganic semiconductors, and metals are preferable for their high electrical conductivity. The above-described heterogeneous material conductive layer of the photo-current multiplication element can be substituted by the conductive layer in the substrate side, or can be substituted by the electrode on the opposite side.

When light is made to be inputted or outputted to or from the electrode surface of the light receiving unit or the light emitting unit, an electrode that transmits light is used. When light is made to be inputted or outputted to or from the surface of the substrate side, a substrate and a conductive layer that transmit light are used. The electrode and the conductive layer that transmit light can be a transparent electrode layer such as ITO, or a very thin metal electrode layer.

When a voltage is applied between an electrode of the light sensing unit and an electrode of the light emitting unit, and light is radiated to the light sensing unit, charges (e.g. electrons) in the number not less than the number of incident photons are injected from the heterogeneous material conductive layer into the photo-current multiplication layer by the photo-current multiplication phenomenon. These charges are injected into the organic EL light emitting layer to emit light from the organic EL light emitting layer. Thereby the obtained outgoing light from the light emitting unit becomes amplified incident light.

The above-described substrate is not necessarily flat. For example, by using a curved substrate, the light incident axis can be inclined from the light emitting axis.

Since the light sensing unit is independent from the light emitting unit, feedback light propagates to the exterior of the element. Therefore, the feedback light can be controlled by adjusting the distance between the light sensing unit and the light emitting unit, or by installing a light shielding member between the light sensing unit and the light emitting unit. When importance is attached to the amplification of outgoing light, feedback light can be adjusted so as to be easily inputted into the photo-current multiplication element; and when importance is attached to response to incident light, feedback light can be adjusted so that the feedback light is difficult to be inputted into the photo-current multiplication element.

Another embodiment of an organic light-light conversion device of the present invention is:

(B) an organic light-light conversion device wherein a light sensing unit having a layer including a photo-conductive organic semiconductor is integrally laminated with a light emitting unit having a layer including an electroluminescent organic semiconductor on the same substrate, and at least one of the photo-conductive organic semiconductor and the electroluminescent organic semiconductor is a polymer semiconductor.

The configuration example is represented by FIG. 1. By radiating incident light 18 from the substrate 11 side onto a photo-current multiplication layer 12, electrons are injected from an electrode 13 to the photo-current multiplication layer 12 by the above-described photo-current multiplication phenomenon, and reach an organic EL light emitting layer 14. Thereby, the organic EL light emitting layer 14 emits light, and outgoing light 19 is obtained. A hole transporting layer 15 supplies holes to bond with electrons when the organic EL light emitting layer 14 emits light, and is not essential in the present invention. A structure wherein the photo-current multiplication layer 12, the electrode 13 of the light sensing unit, the organic EL light emitting layer 14, the hole transporting layer 15 and the electrode 16 of the light emitting unit are laminated in the reverse order from FIG. 1 is also feasible.

The reference numeral 17 represents a DC source, and 20 represents feedback light.

Of the above-described embodiments (A) and (B), (A) is preferable because the freedom of material selection of the light sensing unit and the light emitting unit is larger.

Although the organic light-light conversion device of the present invention is characterized in that at least one of the photo-conductive organic semiconductor and the electroluminescent organic semiconductor is a polymer semiconductor, it is preferable that both the photo-conductive organic semiconductor and the electroluminescent organic semiconductor are polymer semiconductors.

The polymer semiconductor used in the present invention can be selected so that the function of each of the light sensing unit and the light emitting unit wherein the polymer semiconductor is used is exerted; and the photo-conductive organic semiconductor and the electroluminescent organic semiconductor can be either same or different.

Since the wavelength of the light emitted from the light emitting unit is normally determined by the material used in the organic EL light emitting layer, the material used in the organic EL light emitting layer can be selected depending on the wavelength of the desired outgoing light.

The organic light-light conversion device of the present invention is characterized in that not only the wavelengths of the incident light and the outgoing light can be independently selected, but also the light-light conversion efficiency from the incident light to the outgoing light becomes 1 or more. The light-light conversion efficiency is defined by the value obtained by dividing the number of photons outputted as the outgoing light by the number of photons inputted as the incident light, and a high light-light conversion efficiency can be obtained by optimizing the combination of the photo-conductive organic semiconductor and the electroluminescent organic semiconductor used in the organic light-light conversion device. The combination of the photo-conductive organic semiconductor and the electroluminescent organic semiconductor wherein a light-light conversion efficiency of 10 times or more is obtained is preferable, 50 times or more is more preferable, and 200 times or more is especially preferable.

When a polymer semiconductor is used as an electroluminescent organic semiconductor, an organic semiconductor other than polymer semiconductors can be used as a photo-conductive organic semiconductor. Examples of such organic semiconductors include 3,4,9,10-perylenetetracarboxylic 3,4,9,10-bis(methylimide) (abbreviated as Me-PTC), 3,4,9, 10-perylenetetracarboxylic 3,4,9,10-bis(phenylethylimide), 3,4,9,10-perylenetetracarboxylic dianhydride, imidazole perylene, copper phthalocyanine, titanyl phthalocyanine, vanadyl phthalocyanine, magnesium phthalocyanine, non-metal phthalocyanine, naphthalocyanine, naphthalene, 2,9-dimethylquinacridone, unsubstituted quinacridone, pentacene, 6,13-pentacenequinone, 5,7,12,14-pentacenetetrone, and derivatives thereof.

When a polymer semiconductor is used as a photo-conductive organic semiconductor, a layer composed of a polymer semiconductor and a layer composed of an organic semiconductor other than the above-described polymer semiconductor can be laminated and used. In this case, the thickness of the layer composed of an organic semiconductor other than the polymer semiconductor is preferably smaller than the thickness of the layer composed of a polymer semiconductor.

In addition, when a polymer semiconductor is used as a photo-conductive organic semiconductor, an organic semiconductor other than the polymer semiconductor can also be used as an electroluminescent organic semiconductor. An example of such an organic semiconductor is aluminum-quinolinol complex (abbreviated as "Alq$_3$").

The light emitting unit having a layer including an electroluminescent organic semiconductor that emits light by current injection (organic EL light emitting layer) can be composed of an organic EL light emitting layer alone. However, since light emitting in the organic EL light emitting layer is produced by the linkage of charges supplied from the light sensing unit (e.g. electrons) with charges having the opposite polarity in the organic EL light emitting layer (e.g. holes), a layer including a material to transport holes or electrons can be laminated on the organic EL light emitting layer as the light emitting part.

As a material for transporting holes, for example, triphenyl diamine, 3,5-dimethyl-3,5-di-tert-butyl-4,4-diphenoquinone, 2-(4-biphenyl)-5-(4-tert-butylphenyl)-1,3,4-oxadiazole, N,N,N',N'-tetra-(m-toluyl)-m-phenylenediamine, or derivatives thereof can be used.

As the material for transporting electrons, for example, oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives; or metal complexes of 8-hydroxyquinoline or derivatives thereof, polyquinoline or derivatives thereof, polyquinoxaline or derivatives thereof, or polyfluorene or derivatives thereof can be used.

In order to facilitate the injection of holes or electrons, a hole injection layer or an electron injection layer can be laminated and used on the organic EL light emitting layer or the layer containing a material for transporting holes or electrons. Examples of the hole injection layer include:

a layer containing a conductive polymer;

a layer formed between the electrode of the hole-injection side (anode) and the layer containing a material for transporting holes, and containing a material having an ionizing potential of a value intermediate between the anode material and the hole transporting material contained in the hole transporting layer; and a layer formed between the electrode of the electron-injection side (cathode) and the layer containing a material for transporting electrons, and containing a material having an electron affinity of a value intermediate between the cathode material and the electron transporting material contained in the electron transporting layer.

In the case wherein the above-described hole-injection layer or electron-injection layer is a layer containing a conductive polymer, the electrical conductivity of the conductive polymer is preferably $10^{-5}$ S/cm or more and $10^3$ S/cm or less. In order to reduce the leakage current between devices when two or more organic light-light conversion devices are disposed in parallel, the electrical conductivity of the conductive polymer is preferably $10^{-5}$ S/cm or more and $10^2$ S/cm or less, and more preferably $10^{-5}$ S/cm or more and $10^1$ S/cm or less.

In order to make the electrical conductivity of the conductive polymer $10^{-5}$ S/cm or more and $10^3$ S/cm or less, adequate quantities of ions are normally doped into the conductive polymer. The type of doped ions is anions for a hole-injection layer, and cations for an electron-injection layer. Examples of anions include polystyrene sulfonic ions, alkylbenzene sulfonic ions and camphor sulfonic ions; and examples of cations include lithium ions, sodium ions, potassium ions, and tetrabutyl ammonium ions.

The materials used in the above-described hole-injection layer or electron-injection layer can be adequately selected in relation to the materials for the electrodes or adjacent layers, and examples of such materials include conductive polymers, such as polyaniline and derivatives thereof, polythiophene and derivatives thereof, polyphenylenevinylene and derivatives thereof, and polythienylenevinylene and derivatives thereof; metal phthalocyanine (such as copper phthalocyanine) and carbon.

Next, the polymer semiconductor used in the present invention will be described.

As the polymer semiconductor used in the present invention, for example, a polymer semiconductor having a π-conjugated group in the side chain, such as polyvinyl carbazole; a polymer semiconductor having a π-conjugation in the main chain, such as polyarylene and polyarylene vinylene; and a polymer semiconductor having a σ-conjugation in the main chain, such as polysilane. Of these, the polymer semiconductor having conjugation in the main chain is preferable, the polymer semiconductor having a π-conjugation in the main chain is more preferable, and the polymer semiconductor having at least one of repeating units represented by Formula (1):

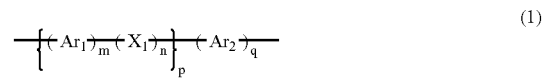

wherein $Ar_1$ and $Ar_2$ each independently represent an arylene group or a divalent heterocyclic group; $X_1$ represents —$CR_1$=$CR_2$—, —C≡C— or —N($R_3$)—; $R_1$ and $R_2$ each independently represent a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group; m, n and q each independently represent an integer of 0 or 1; p represents an integer of 0 to 2; and m+n and p+q are each 1 or more, provided that $Ar_1$, $X_1$, $R_1$, $R_2$ and $R_3$, if they are each multiple, can be respectively identical or different, and having a polystyrene-converted number average molecular weight of $1 \times 10^3$ to $1 \times 10^8$ is more preferable.

The specific examples of arylene groups in $Ar_1$ and $Ar_2$ in Formula (1) include phenylene groups (e.g. the following formulas 1 to 3), naphthalenediyl groups (the following formulas 4 to 13), anthracenylene groups (the following formulas 14 to 19), biphenylene groups (the following formulas 20 to 25), triphenylene groups (the following formulas 26 to 28), and condensed cyclic compound groups (the following formulas 29 to 38). Of these, phenylene groups, biphenylene groups and fluorene-diyl groups (the following formulas 36 to 38) are preferable.

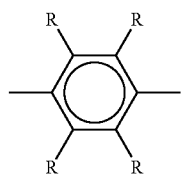

1

2
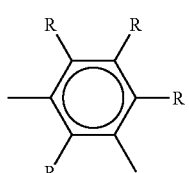
3
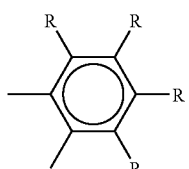
4
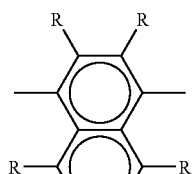
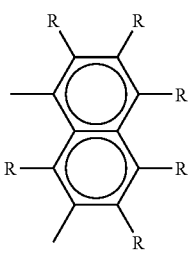
5
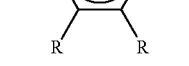
6
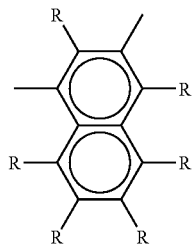
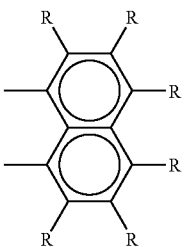
7
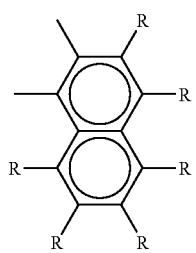
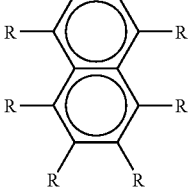
8
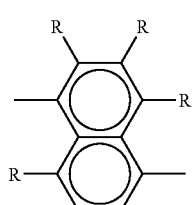
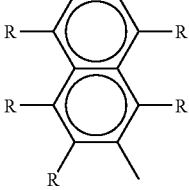
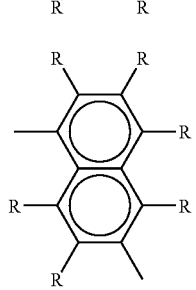
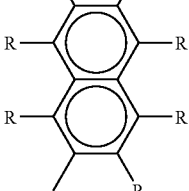
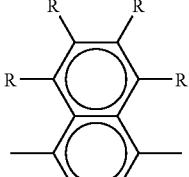
9
10
11
12
13
14
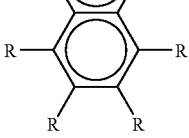

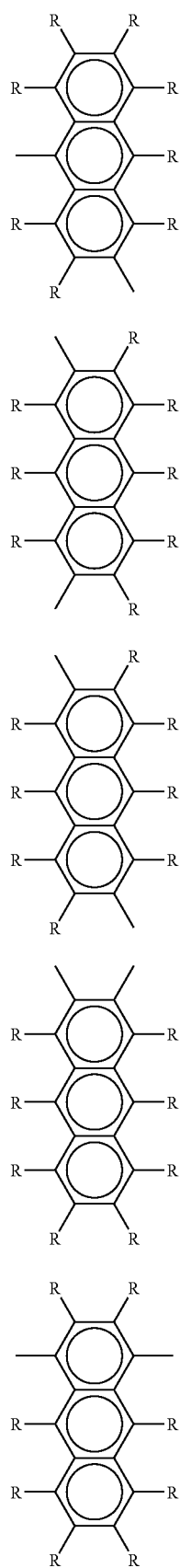
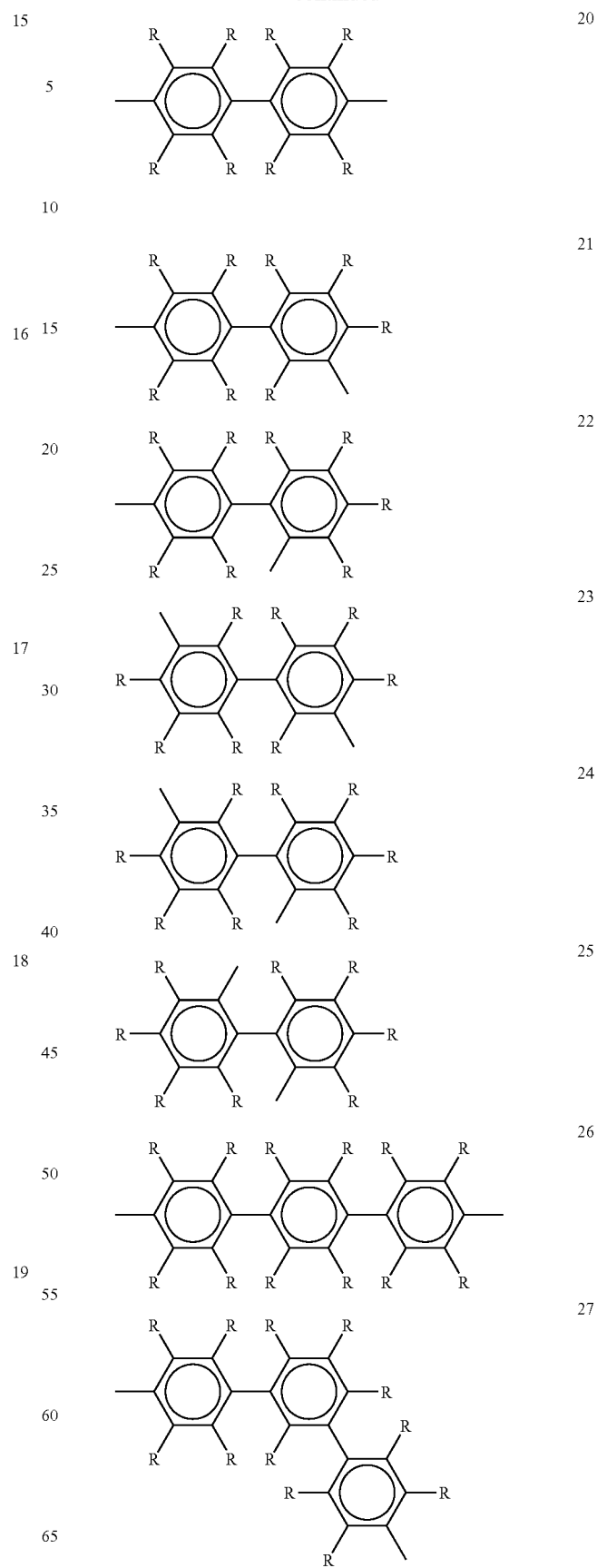

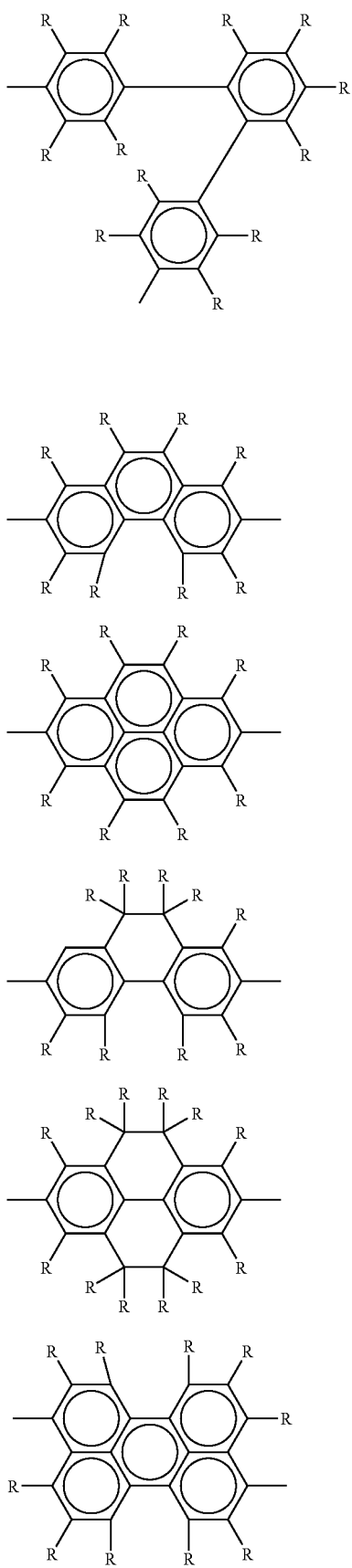

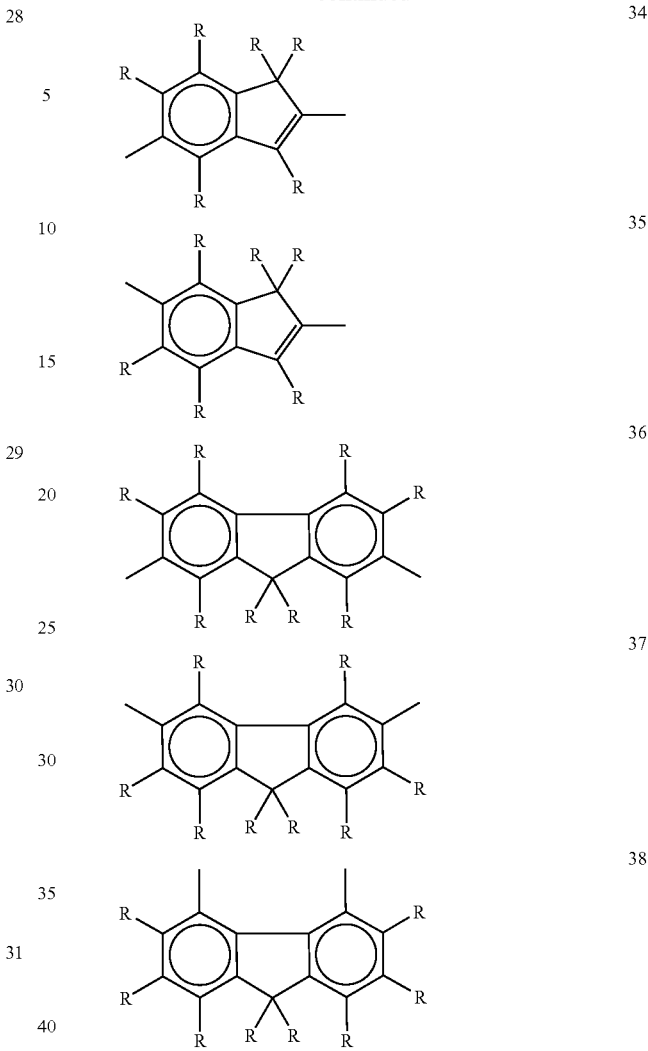

A divalent heterocyclic group in $Ar_1$ and $Ar_2$ in Formula (1) is a remaining atomic group after removing 2 hydrogen atoms from a heterocyclic compound, and the number of carbon atoms is normally 3 to about 60.

The term "heterocyclic compound" used herein means an organic compound having a cyclic structure wherein atoms constituting the ring are not only carbon atoms, but also hetero atoms, such as oxygen, sulfur, nitrogen, phosphorus, boron and arsenic, are contained in the ring.

The specific examples of divalent heterocyclic groups are as follows:

Divalent heterocyclic groups containing nitrogen as a hetero atom: pyridine-diyl groups (following Formulas 39 to 44), diazaphenylene groups (following Formulas 45 to 48), quinoline-diyl groups (following Formulas 49 to 63), quinoxaline-diyl groups (following Formulas 64 to 68), acrydine-diyl groups (following Formulas 69 to 72), bipyridyl-diyl groups (following Formulas 73 to 75), phenanthroline-diyl groups (following Formulas 76 to 78) and the like.

Groups having a fluorene structure containing silicon, nitrogen, oxygen, sulfur, selenium or the like as a hetero atom (following Formulas 79 to 93).

Five-membered ring heterocyclic groups containing silicon, nitrogen, oxygen, sulfur, selenium or the like as a hetero atom (following Formulas 94 to 98).

Five-membered ring condensed heterocyclic groups containing silicon, nitrogen, oxygen, sulfur, selenium or the like as a hetero atom (following Formulas 99 to 110).

Five-membered ring heterocyclic groups containing silicon, nitrogen, oxygen, sulfur, selenium or the like as a hetero atom, which bond at the α-position of the hetero atom to form a dimmer or an oligomer (following Formulas 111 and 112).

Five-membered ring heterocyclic groups containing silicon, nitrogen, oxygen, sulfur, selenium or the like as a hetero atom, which bond to a phenyl group at the α-position of the hetero atom (following Formulas 113 to 119).

Groups wherein five-membered ring heterocyclic groups containing oxygen, nitrogen, sulfur or the like as a hetero atom, substituted by a phenyl group, a furyl group or a thienyl group (following Formulas 120 to 125).

Of these, heterocyclic groups containing nitrogen, oxygen or sulfur as a hetero atom are preferable; heterocyclic groups containing a furyl group (following Formulas 96, 124 and 125), heterocyclic groups containing a thienylene group (following Formulas 97, 111 to 113, 122 and 123), and heterocyclic groups containing a pyridine-2,5-diyl group (following Formula 41) are further preferable; and heterocyclic groups containing a thienylene group and a thienylene group having a substituent are especially preferable.

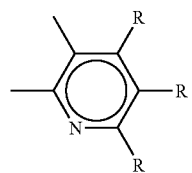

39

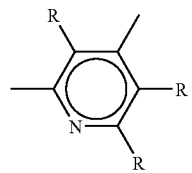

40

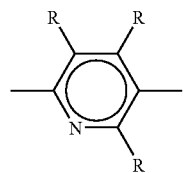

41

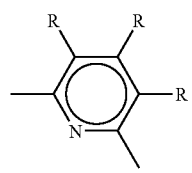

42

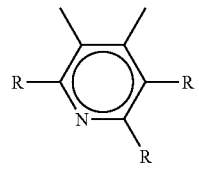

43

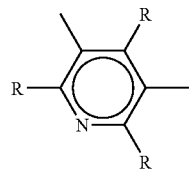

44

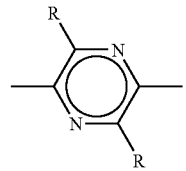

45

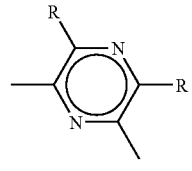

46

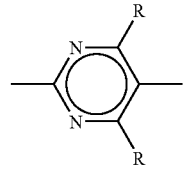

47

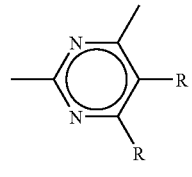

48

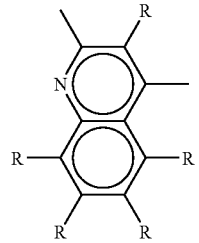

49

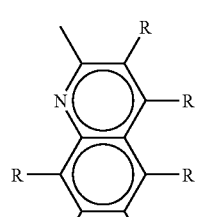

50

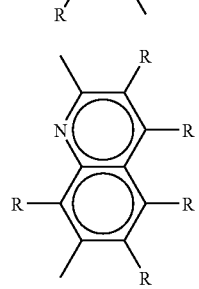

51

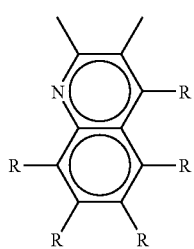 52
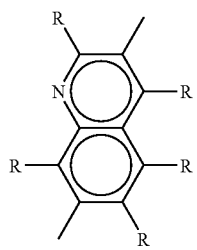 58
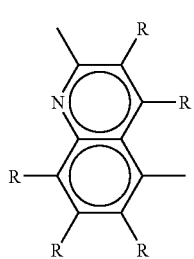 53
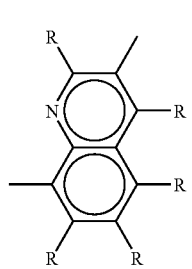 59
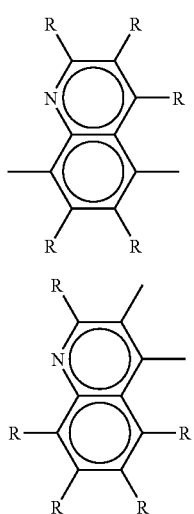 54
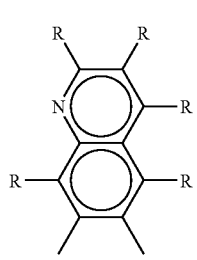 60
55
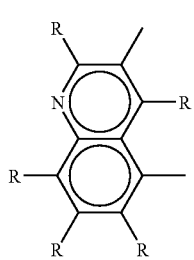 56
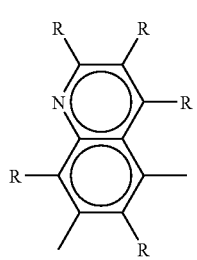 61
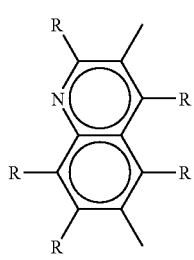 57
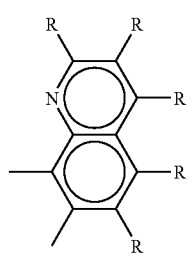 62
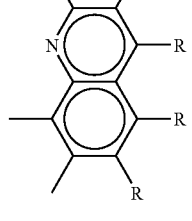 63

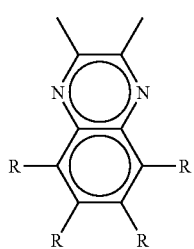
64
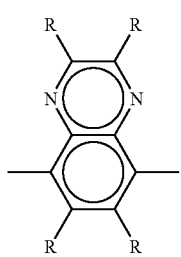
65
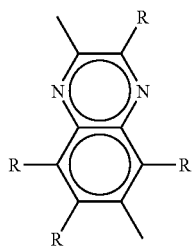
66
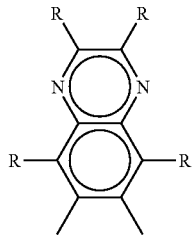
67
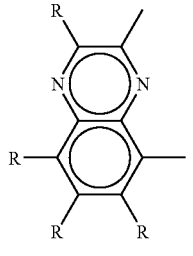
68
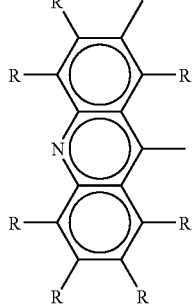
69
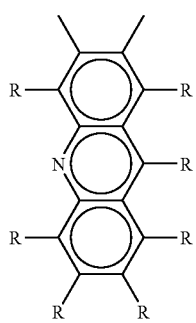
70
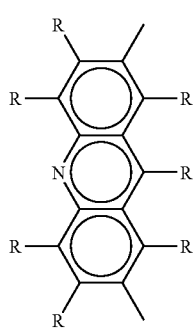
71
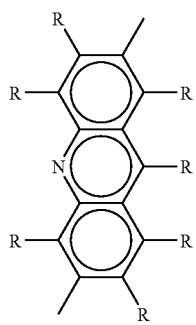
72
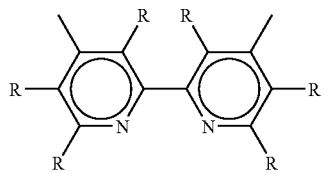
73
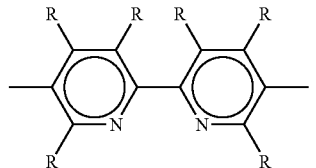
74
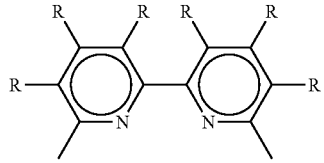
75

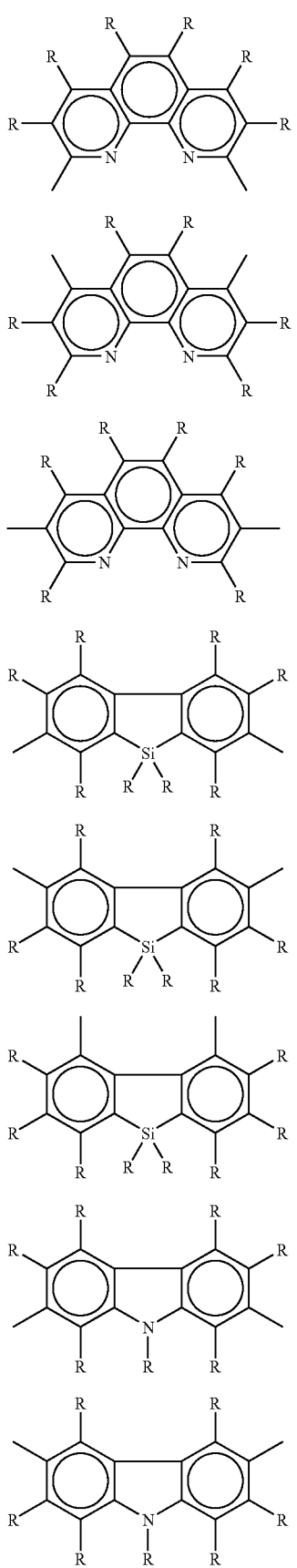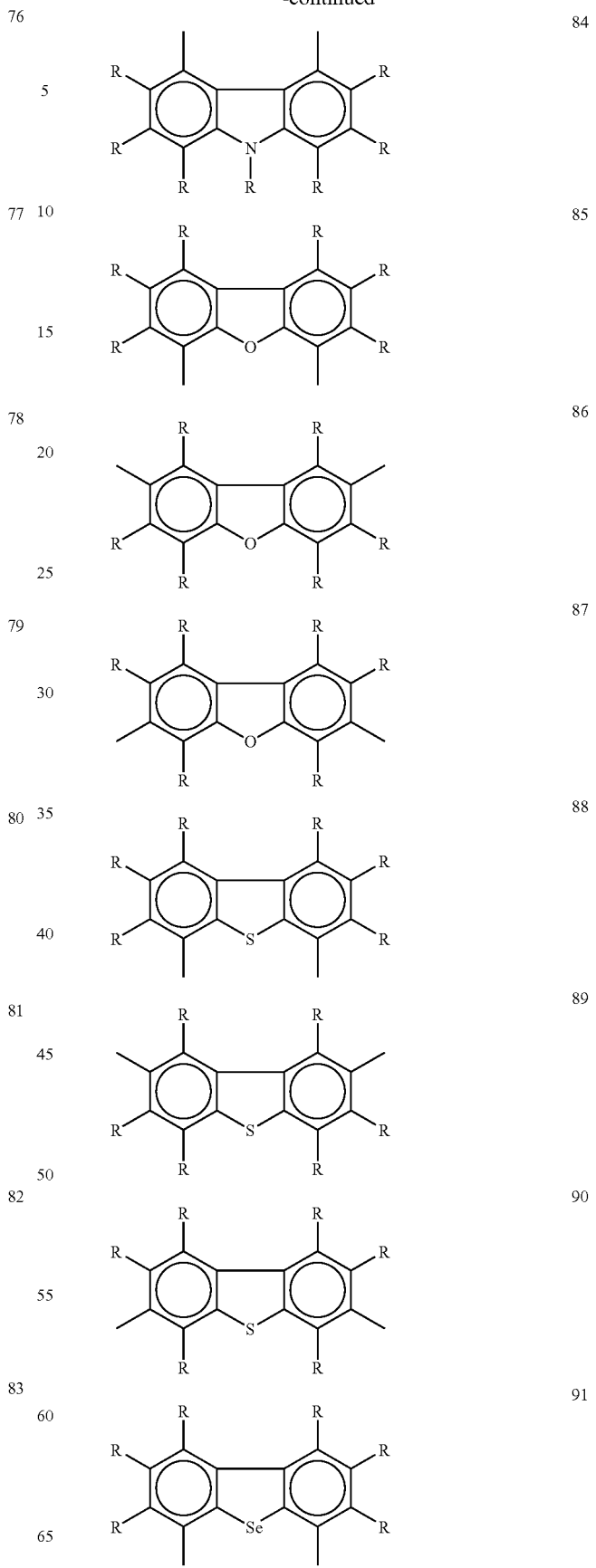

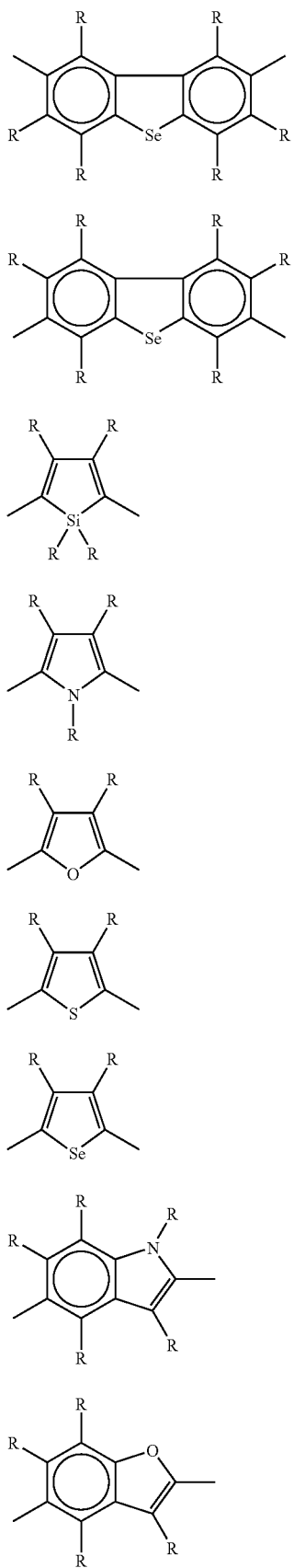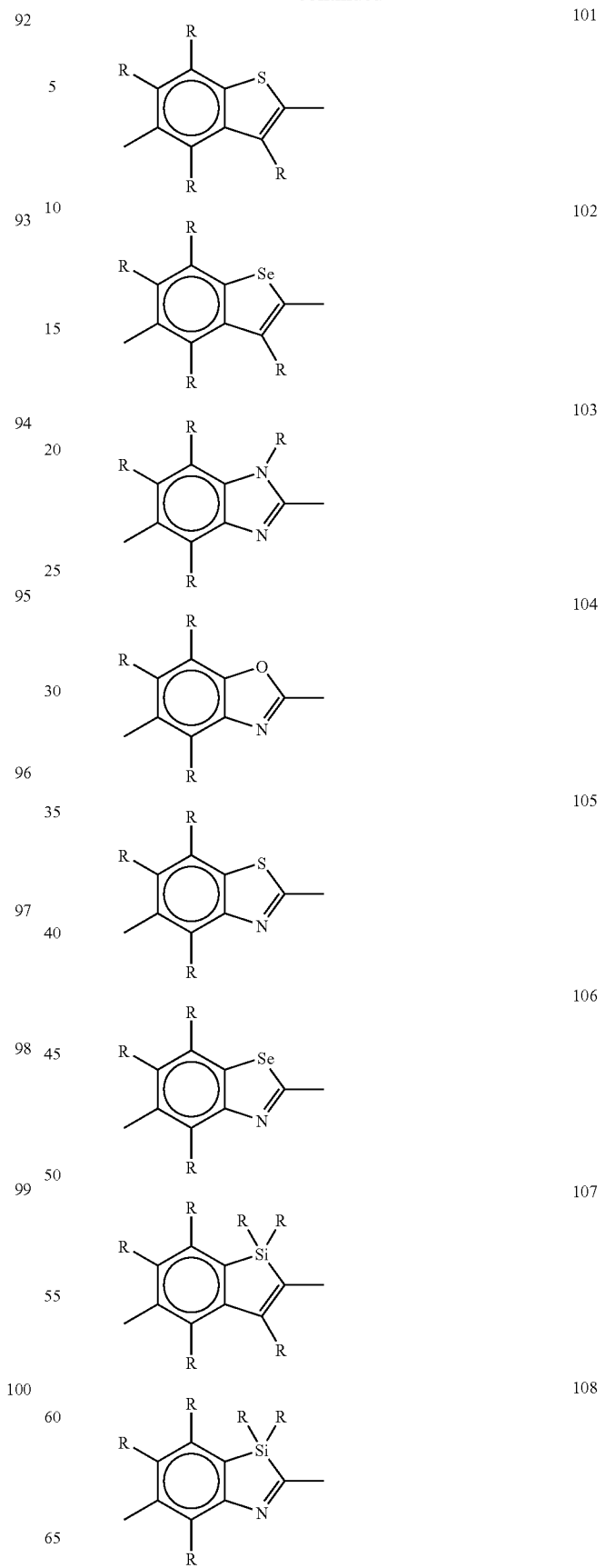

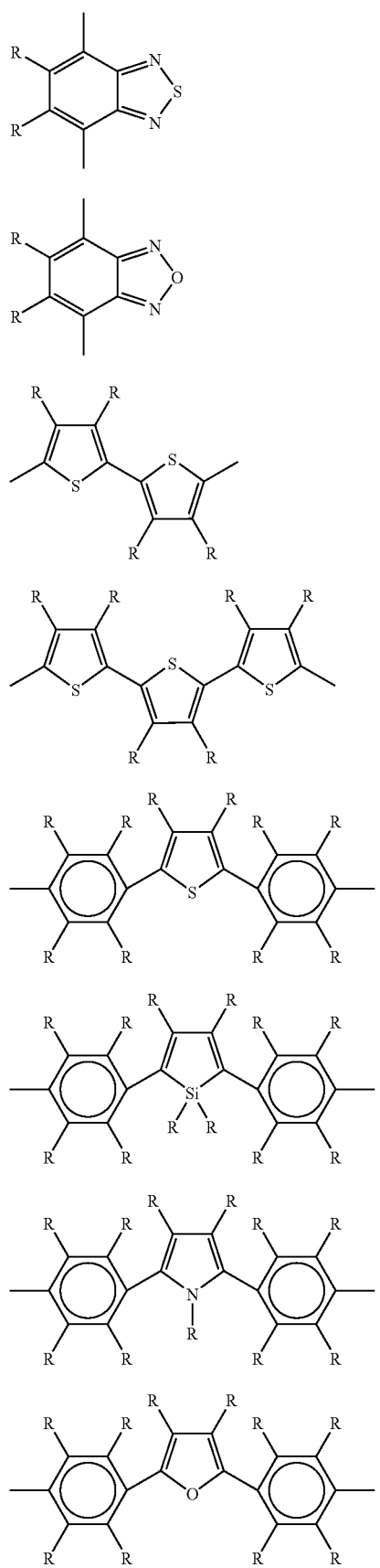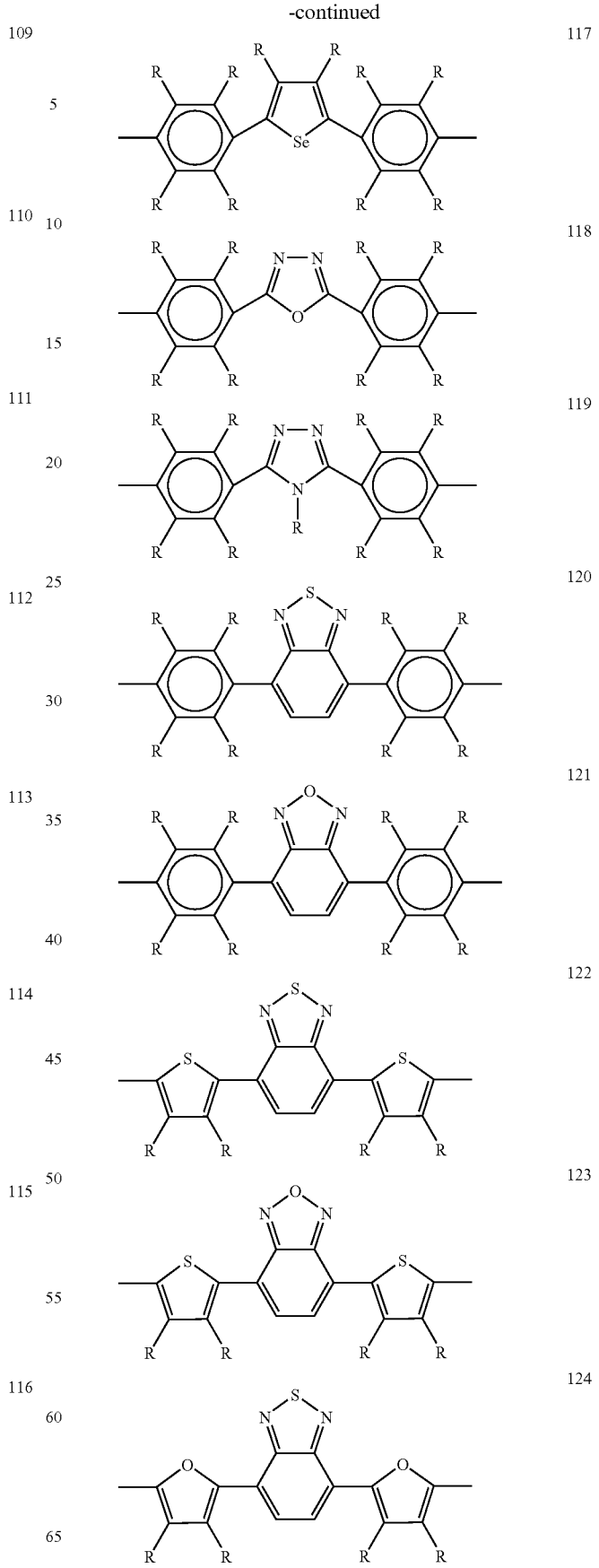

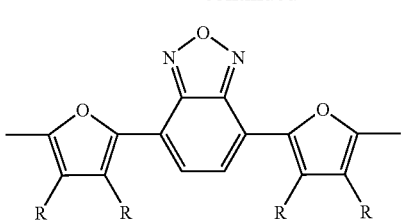

(Here, each R in the formulas 1 to 125 independently represents a hydrogen atom, a cyano group, an alkyl group, an alkoxy group, an alkylthio group, an aryl group, an alkoxy group, or a monovalent heterocyclic group. When a plurality of R's are present, they can be identical or different.)

In the substituents in $Ar_1$ and $Ar_2$, the alkyl group is linear, branched or cyclic, usually has about 1 to 20 carbon atoms, and specifically, a methyl group, ethyl group, n-propyl group, isopropyl group, n-butyl group, isobutyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, and cyclododecyl group can be cited, among which a pentyl group, hexyl group, octyl group, decyl group, and cyclohexyl group are preferable.

The alkoxy group has usually about 1 to 20 carbon atoms, and the alkyl part thereof is linear, branched or cyclic. Specifically, examples include a methoxy group, ethoxy group, n-propyloxy group, isopropyloxy group, n-butoxy group, isobutoxy group, tert-butoxy group, pentyloxy group, hexyloxy group, heptyloxy group, octyloxy group, nonyloxy group, decyloxy group, lauryloxy group, cyclopropyloxy group, cyclobutyloxy group, cyclopentyloxy group, cyclohexyloxy group, and cycloheptyloxy group, among which a pentyloxy group, hexyloxy group, octyloxy group, decyloxy group, and cyclohexyloxy group are preferable.

The alkylthio group has usually about 1 to 20 carbon atoms, and the alkyl part thereof is linear, branched or cyclic. Examples include a methylthio group, ethylthio group, n-propylthio group, isopropylthio group, n-butylthio group, isobutylthio group, tert-butylthio group, pentylthio group, hexylthio group, heptylthio group, octylthio group, nonylthio group, decylthio group, laurylthio group, cyclopropylthio group, cyclobutylthio group, cyclopentylthio group, cyclohexylthio group, and cycloheptylthio group, among which a pentylthio group, hexylthio group, octylthio group, decylthio group, and cyclohexylthio group are preferable.

Examples of aryl groups include a phenyl group, 4-$C_1$ to $C_{12}$ alkoxyphenyl group ($C_1$ to $C_{12}$ means that the number of carbon atoms is 1 to 12, the same applies to the followings), 4-$C_1$ to $C_{12}$ alkylphenyl group, 1-naphthyl group and 2-naphthyl group.

Examples of monovalent heterocyclic groups include 2-thienyl group, 2-pirrolyl group, 2-furyl group, and 2-, 3- or 4-pyridyl group.

The substituent in $Ar_1$ and $Ar_2$ is preferably an alkoxy group.

From the viewpoint of the solubility of polymer semiconductors to organic solvents, either one or both of $Ar_1$ and $Ar_2$ have preferably two or more substituents, and all of these substituents are preferably different. When substituents having the same number of carbon atoms are compared, concerning alkyl groups, branched substituents are more preferable than linear ones.

$X_1$ in Formula (1) represents —$CR_1$=$CR_2$—, —C≡C— or —$N(R_3)$—, and —$CR_1$=$CR_2$— and —$N(R_3)$— are preferable. Each of $R_1$ and $R_2$ independently represents a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group. When $R_3$ is an aryl group, a monovalent heterocyclic group or an arylalkyl group, it can further have a substituted amino group.

Here, the alkyl group is linear, branched or cyclic, the number of carbon atoms is normally 1 to about 20, and specifically, a methyl group, ethyl group, n-propyl group, isopropyl group, n-butyl group, isobutyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, and cyclododecyl group can be cited, among which a pentyl group, hexyl group, octyl group, decyl group, and cyclohexyl group are preferable.

Examples of aryl groups include a phenyl group, 4-$C_1$ to $C_{12}$ alkoxyphenyl group, 4-$C_1$ to $C_{12}$ alkylphenyl group, 1-naphthyl group and 2-naphthyl group.

Examples of monovalent heterocyclic groups include 2-thienyl group, 2-pirrolyl group, 2-furyl group, and 2-, 3- or 4-pyridyl group.

A substituted carboxyl group means a carboxyl group substituted by an alkyl group, an aryl group, an arylalkyl group or a monovalent heterocyclic group; and has usually about 2 to 60 carbon atoms, preferably 2 to 48. The number of carbon atoms in the substituted carboxyl group does not contain the number of carbon atoms in the substituent. Examples of substituted carboxyl groups include a methoxycarbonyl group, ethoxycarbonyl group, propoxycarbonyl group, isopropoxycarbonyl group, butoxycarbonyl group, isobutoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-demethyl octyloxycarbonyl group, docecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, and pyridyloxycarbonyl group. The alkyl group, aryl group, arylalkyl group or monovalent heterocyclic group can have a substituent.

The arylalkyl group has normally 7 to about 60, preferably 7 to 48 carbon atoms. Specifically, examples of arylalkyl groups include a phenyl-$C_1$ to $C_{12}$ alkyl group, $C_1$ to $C_{12}$ alkoxyphenyl-$C_1$ to $C_{12}$ alkyl group, $C_1$ to $C_{12}$ alkylphenyl-$C_1$ to $C_{12}$ alkyl group, 1-naphthyl-$C_1$ to $C_{12}$ alkyl group, and 2-naphthyl-$C_1$ to $C_{12}$ alkyl group; and the $C_1$ to $C_{12}$ alkoxyphenyl-$C_1$ to $C_{12}$ alkyl group and $C_1$ to $C_{12}$ alkylphenyl-$C_1$ to $C_{12}$ alkyl group are preferable.

Examples of substituted amino groups include amino groups substituted by one or two groups selected from a group consisting of an alkyl group, aryl group, arylalkyl group and monovalent heterocyclic group. The alkyl group, aryl group, arylalkyl group and monovalent heterocyclic group can further have a substituent. The number of carbon atoms in the substituted amino group not including carbon atoms in the substituent is usually about 1 to 60, preferably 2 to 48.

The specific examples of substituted amino groups include a methylamino group, dimethylamino group, ethylamino group, diethylamino group, propylamino group, dipropylamino group, isopropylamino group, diisopropylamino group, butylamino group, isobutylamino group, t-butylamino group, pentylamino group, hexylamino group, cyclohexylamino group, heptylamino group, octylamino group, 2-ethyl hexylamino group, nonylamino group, decylamino group, 3,7-dimethyl octylamino group, laurylamino group, cyclopentylamino group, dicyclopentylamino group, cyclohexylamino group, dicyclohexylamino group, pyrrolidyl group, pyperidyl group, di-trifluoromethylamino group, phenylamino group, diphenylamino group, $C_1$ to $C_{12}$ alkoxyphenylamino group, di-($C_1$ to $C_{12}$ alkoxyphenyl)-amino group, di-($C_1$ to $C_{12}$ alkylphenyl)-amino group, 1-naphthylamino group, 2-naphthylamino group, pentafluoro phenylamino group, pyridylamino group, pyridazinylamino group, pyrimidylamino group, pyrazylamino group, triazylamino group, phenyl-$C_1$ to $C_{12}$ alkylamino group, $C_1$ to $C_{12}$ alkoxyphenyl-$C_1$ to $C_{12}$ alkylamino group, $C_1$ to $C_{12}$ alkylphenyl-$C_1$ to $C_{12}$ alkylamino group, di-($C_1$ to $C_{12}$ alkoxyphenyl-$C_1$ to $C_{12}$ alkyl)-amino group, di-($C_1$ to $C_{12}$ alkylphenyl-$C_1$ to $C_{12}$ alkyl)-amino group, 1-naphthyl-$C_1$ to $C_{12}$ alkylamino group, and 2-naphthyl-$C_1$ to $C_{12}$ alkylamino group.

Examples of repeating units represented by Formula (1) include:

 (2)

 (3)

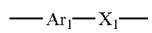 (4)

 (5)

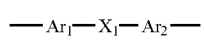 (6)

 (7)

wherein $Ar_1$, $Ar_2$ and $X_1$ are the same as those in Formula (1), and $Ar_1'$ represents another $Ar_1$ when M=2, provided that the two $Ar_1$s are different.

The specific examples of Formula (2) are the following Formulas (8) and (9); the specific example of Formula (3) is the following Formula (10); the specific example of Formula (4) is the following formula (11); the specific example of Formula (5) is the following formula (12); the specific examples of Formula (6) are the following Formulas (13), (14) and (15); and the specific examples of Formula (6) are the following Formulas (16) and (17).

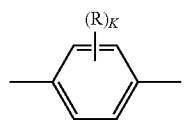 (8)

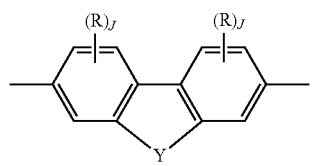 (9)

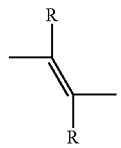 (10)

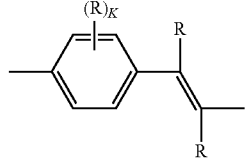 (11)

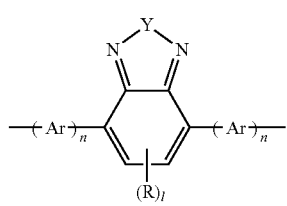 (12)

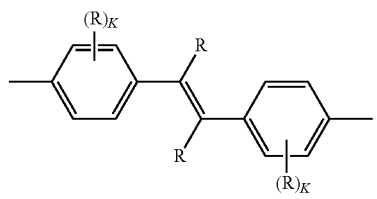 (13)

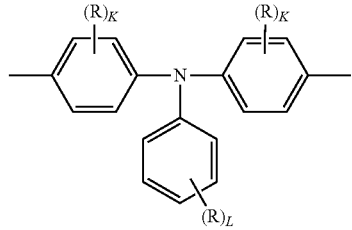 (14)

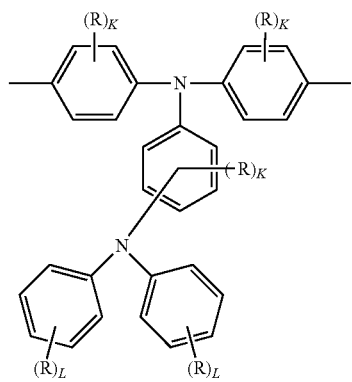 (15)

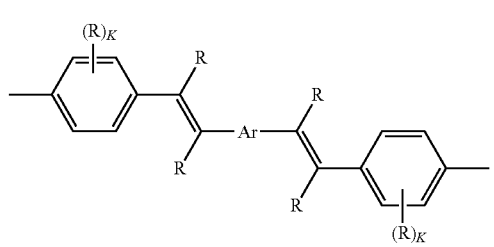 (16)

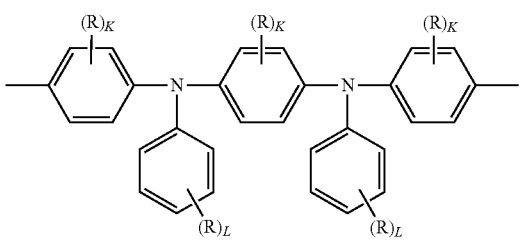

(17)

(where Ar represents an arylene group or a divalent heterocyclic group; and R represents a hydrogen atom, a cyano group, an alkyl group, an alkoxy group, an alkylthio group, an aryl group, an aryloxy group, or a monovalent heterocyclic group. When a plurality of R's are present, they can be same or different. Y represents O, S, SO$_2$, Se, Te, N—R", CR'R" or SiR'R"; where each of R' and R" represents an alkyl group, an alkoxy group, an aryl group, a monovalent heterocyclic group or an arylalkyl group; n represents an integer of 0 or 1; I represents an integer from 0 to 2; J represents an integer from 0 to 3; K represents an integer from 0 to 4; and L represents an integer from 0 to 5.)

When a polymer semiconductor used in the present invention has a repeating unit represented by Formula (1), the polymer semiconductor can be a random, block or graft copolymer containing two or more kinds of repeating units represented by Formula (1), or can be a polymer semiconductor having an intermediate structure thereof, for example, a random copolymer with some characteristics of a block copolymer. From the viewpoint of obtaining an organic light-light conversion element having excellent properties, the random copolymer with some characteristics of a block copolymer, or a block or graft copolymer is more preferable than a perfect random copolymer. The case wherein the main chain is branched, or the case wherein there are 3 or more end portions is also included.

Although the end group of the polymer semiconductor used in the present invention is not specifically limited, if a polymerization activating group remains intact, there is possibility that the characteristics are lowered when it is used in an active layer; therefore, the polymer semiconductor is preferably protected by a stable group. The polymer semiconductor having a conjugated bond continued from the conjugated structure of the main chain is more preferable, and an example is a structure bonded to an aryl group or a heterocyclic group through a vinylene group. Specifically, the substituent represented by Formula 10 in JP-A-9-45478 and the like are exemplified.

The polystyrene-converted number average molecular weight of the polymer semiconductor used in the present invention is normally $1 \times 10^3$ to $1 \times 10^8$. If the molecular weight is excessively low, obtaining a homogeneous thin film tends to be difficult; and if the molecular weight is excessively high, the polymer semiconductor tends to be gelled, and thin film formation tends to be difficult. From the aspect of film formation, the number average molecular weight is preferably $1 \times 10^4$ to $2 \times 10^7$, more preferably $1 \times 10^5$ to $1 \times 10^7$.

Examples of favorable solvents for the polymer semiconductor include chloroform, methylene chloride, dichloroethane, tetrahydrofuran, toluene, xylene, mesitylene, decalin, n-butyl benzene and the like. Depending on the structure or molecular weight of the polymer semiconductor, 0.1% by weight or more can be normally dissolved in these solvents.

An example of methods for synthesizing the polymer semiconductor used in the present invention, when the main chain has vinylene groups, is the method described in JP-A-5-202355. Specifically, examples of the methods include polymerization by the Wittig reaction, such as the polymerization of a dialdehyde compound with a diphosphonium salt compound, or the polymerization of a dialdehyde compound with a diphosphite ester by the Horner-Wadsworth-Emmons method; the polymerization of a divinyl compound with a dihalide compound or vinyl-halogen compound alone by the Heck reaction; the polycondensation of a compound having two halogenated methyl groups by the dehalogenation method; the polycondensation of a compound having two sulfonium salt groups by the sulfonium salt decomposition method; methods for the polymerization of a dialdehyde compound with a diacetonitrile compound by the Knoevenagel reaction or the like; and methods for the polymerization of a dialdehyde compound by the McMurry reaction.

When the main chain has no vinylene groups, examples of the methods include a method for polymerization from a corresponding monomer by the Suzuki coupling reaction; a method for polymerization by the Grignard reaction; a method for polymerization by Ni(0) complex; a method for polymerization by an oxidant such as FeCl$_3$; a method for polymerization by electrochemical oxidation; and a method by the decomposition of an intermediate product having suitable eliminating groups.

Of these methods, polymerization by the Wittig reaction, polymerization by the Heck reaction, polymerization by the Knoevenagel reaction, the method for polymerization by the Suzuki coupling reaction (WO 00/53656 and WO 00/55927), the method for polymerization by the Grignard reaction, and the method for polymerization by nickel (0) complex are preferable because of easy control of the structure.

When these polymer semiconductors are used in an organic light-light conversion element, since the purity thereof affects the properties, it is preferable to perform purification treatment, such as reprecipitation purification and chromatographic isolation after the synthesis.

In the device of the present invention, when a polymer semiconductor containing one or more repeating units represented by Formula (1) is used in the photo-current multiplication layer and the organic EL light emitting layer, one kind of the polymer semiconductor containing one or more repeating units represented by Formula (1) can be used, or the mixture of two or more kinds of polymer semiconductors containing one or more repeating units represented by Formula (1) can also be used. Further, the mixture of polymers other than the polymer semiconductor represented by Formula (1) can also be used within the range not inhibiting the properties of the organic light-light conversion element. Examples of polymers to be mixed include general purpose polymers, such as polycarbonate, polyvinyl butyral, polyvinyl alcohol, polystyrene and polymethyl methacrylate, and conductive polymers, such as polyvinyl carbazole and polysilane.

At this time, the proportion of the polymer semiconductor represented by Formula (1) is within the range between 10% and 100%, more preferably within the range between 30% and 100%, and further preferably within the range between 50% and 100%.

As the polymer semiconductor as a photo-conductive organic semiconductor used in the photo-current multiplication layer, since it is required to efficiently isolate electron-hole pairs formed by received light and to transport them to the electrodes, it is preferable that the polymer semiconductor has high transporting ability for at least one of electrons and holes and low probability of recombination of electron-hole pairs. Furthermore, since the photo-current multiplication phenomenon is a phenomenon caused in the boundary between the heterogeneous material conductive layer and the layer composed of the photo-conductive organic semiconductor, and it is required that tunneling injection can be easily performed, the combination of the heterogeneous material conductive layer and the polymer semiconductor is important. The combination of these can be suitably selected depending on the HOMO and LUMO levels of the polymer semiconductor, and the HOMO and LUMO levels (work functions in the case of metals) of the heterogeneous material conductive layer. For example, when the tunneling injection of electrons is used as the photo-current multiplication phenomenon, a polymer semiconductor containing a repeating unit represented by Formula (1) with high electron transporting ability, for example, a polymer semiconductor containing a repeating unit, such as fluorene, silole, oxazole, oxadiazole, triazole and derivatives thereof is selected. As the material for the heterogeneous material conductive layer, for example in the case of metals, combination with an electrode material having a relatively large work function, such as gold, silver, platinum, aluminum and ITO, is preferable. When the tunneling injection of holes is used as the photo-current multiplication phenomenon, a polymer semiconductor containing a repeating unit represented by Formula (1) with high hole transporting ability, for example, a polymer semiconductor containing a repeating unit, aromatic amines such as triphenyl amine, aniline, thiophene, pyrrole, hydrazone, pyrazoline, and derivatives thereof is selected. As the material for the heterogeneous material conductive layer, for example in the case of metals, combination with an electrode material having a relatively small work function, such as alkali metals such as lithium, alkaline earth metals such as magnesium and calcium, is preferable.

Furthermore, for the purpose to efficiently isolate electron-hole pairs formed by received light, electron donating compounds such as phthalocyanine pigments and quinacridone pigments, or electron accepting compounds such as perylene pigments, perynone pigments and fullerene can be mixed.

On the other hand, as a polymer semiconductor used in the organic EL light emitting layer, since it is required to efficiently transport electrons and holes injected from each electrode and efficiently emitting light and recombine the transported electrons and holes, a polymer semiconductor having high transporting ability for both electrons and holes and high light emitting quantum yield in a molecule is preferable. For example, a polymer semiconductor containing both repeating units shown by Formula (1) having high electron transporting ability and high hole transporting ability; or the mixture of a polymer semiconductor containing repeating units shown by Formula (1) having high electron transporting ability and a polymer semiconductor containing repeating units shown by Formula (1) having high hole transporting ability is preferable.

By two-dimensionally arranging a plurality of organic light-light conversion devices according to the present invention, an image intensifier to sense weak light invisible to the naked eye or light other than visible light, such as infrared beams and ultraviolet beams in the light sensing unit, and output it as visible light (i.e. image) from the light emitting unit can be constituted. Depending on applications, one-dimensional arrangement is also effective.

The voltage applied to the device of the present invention is distributed into the light sensing unit and the light emitting unit. Since the number of electrons formed in the photo-current multiplication layer is increased and the electrical resistance of the light sensing unit is lowered when the intensity of incident light to the light receiving unit is larger, the voltage distributed to the light emitting unit is raised, and intensity of the outgoing light is enlarged.

In the organic light-light conversion device of the present invention, since the voltage distributed to the light emitting unit can be easily measured, the value of the voltage from the light emitting unit can be used as the electrically signalized intensity of the incident light and the outgoing light. Thereby, the device can be used as a light sensor that detects the intensity of the incident light as electrical signals. Since the value of thus outputted voltage corresponds to the quantity of incident light, the device functions as a light sensor.

Specifically, the light sensor of the present invention is characterized in having an organic light-light conversion device and means for measuring and outputting the voltage across both ends of the layer containing an electroluminescent organic semiconductor (organic EL light emitting layer). Furthermore, the device can emit light, for example, by some electricity-light conversion from the exterior where the above-described electrical signals are received while emitting light from the light emitting unit.

Examples for describing the present invention in further detail will be shown below; however, the present invention is not limited thereto.

Here, the polystyrene-converted number average molecular weight was obtained using a gel permeation chromatography (GPC) method as follows:

Using a column: Pl gel mix-B+mix-C (8 mm I.d.×30 cm); and a sensor: RI (Shodex RI-101), 50 μl of a chloroform solution of a polymer adjusted to have a concentration of 1.0 mg/ml was injected, and measurement was performed under the chloroform flow rate condition of 1.0 ml/min.

EXAMPLE 1

<Synthesis of Polymer Semiconductor>

Poly(9,9-dioctylfluorene) (PFO) was synthesized using the method described in WO 00/53656 . The number average molecular weight of the PFO was $4.8 \times 10^4$. Poly(2,7-(9,9-dioctylfluorene)-alt-(1,4-phenylene((4-sec-butylphenyl) imino)-1,4-phenylene)) (TFB) was synthesized using the method described in WO 00/55927. The number average molecular weight of the TFB was $1.8 \times 10^4$.

<Fabrication of Organic Light-Light Conversion Device>

On a glass substrate with a patterned ITO film, the suspension of poly(3,4-ethylene dioxythiophene/polystyrene sulfonic acid PEDOT) (Bytron P TP AI 4083 manufactured by Bayer) was applied by spin coating to form a film, and after peeling the film leaving a part on the ITO, the film was dried on a hot plate at 200° C. for 10 minutes. Onto the film, a solution prepared by mixing toluene solutions of PFO and TFB in the weight ratio of 6:4 and filtering with a 0.2-μm filter was applied by spin coating to form a thin polymer semiconductor film. The thin polymer semiconductor film other than the area on the PEDOT was peeled, and set in a vacuum vapor deposition apparatus. An MgAg film having a thickness of 30 nm was formed as a cathode by co-deposition method at a speed of 5:0.5 angstroms/sec on the remaining thin polymer semiconductor film using a shadow mask. An Ag film having a thickness of 20 nm was formed thereon at a speed of 0.6 angstroms/sec to form a light emitting unit. The shadow mask was moved, the PEDOT and thin polymer semiconductor film was peeled, and a film of a photo-conductive organic semiconductor, naphthalene tetracarboxylic dianhydride (NTCDA) having a thickness of 600 nm was formed on the part where the ITO was exposed at a speed of 2.5 angstroms/ sec. An Au film having a thickness of 20 nm was formed thereon as an electrode at a speed of 0.4 angstroms/sec to form a light receiving unit.

<Characteristic Evaluation of Organic Light-Light Conversion Device>

Figure 2:
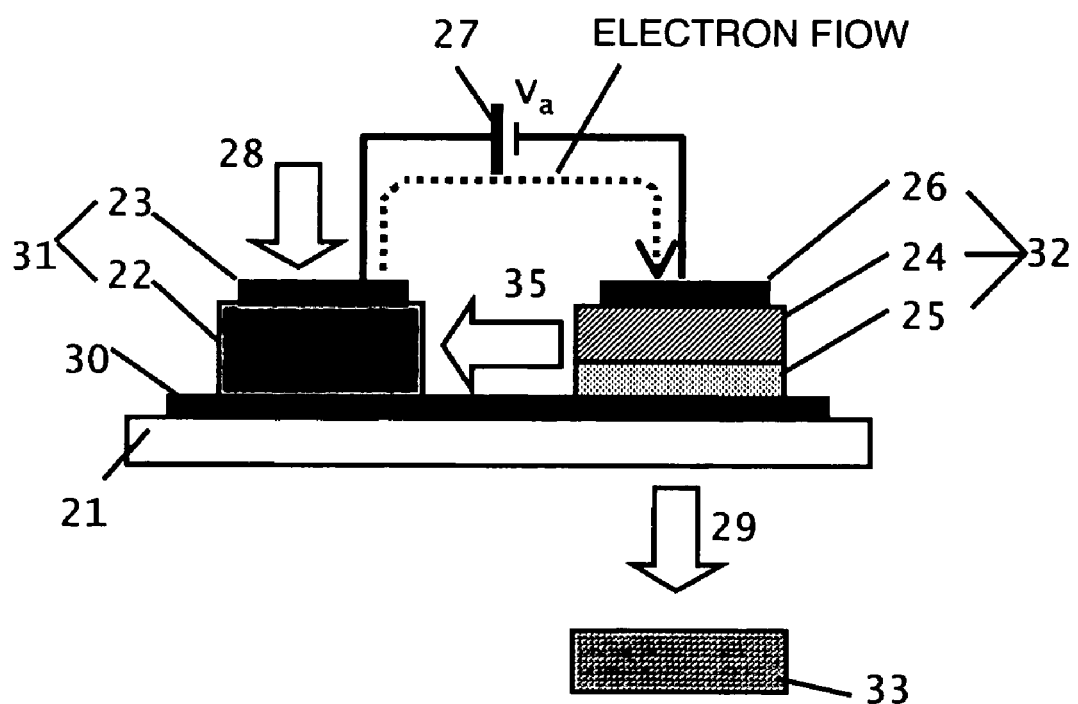
FIG. 2 is a sectional view showing an example of a light-light conversion device of the present invention.

FIG. 2 shows a sectional view of a coplanar-type organic light-light conversion device according to the present invention. A direct current source 27 was connected to the electrode 23 of the light sensing unit and the electrode 26 of the light emitting unit as FIG. 2 shows, and a voltage Va was applied between the light sensing unit 31 and the light emitting unit 32 from the direct current source 27. As described below, for the purpose of checking the characteristics of the device, several values of the voltages Va between 5 and 30 V were used. In the state wherein the voltage Va was applied between the light sensing unit 31 and the light emitting unit 32, incident light 28 of a wavelength of 400 nm and an intensity of 56 $\mu W/cm^2$ was radiated from the surface of the electrode 23 to the light sensing unit 31. As a result, outgoing light 29 of a wavelength of 450 nm was obtained from the substrate 21 side of the light emitting unit 32. The wave length of the incident light 28 was different from the wave length of the outgoing light 29, and wavelength conversion, which is one of the characteristics of the light-light conversion device, was performed. Depending on the selection of materials for the organic EL light emitting layer 24, outgoing light of further different colors can also be obtained. In FIG. 2, reference numeral 21 represents a substrate, 22 represents a photo-current multiplication layer, 24 represents an organic EL light emitting layer, 25 represents a hole transporting layer, 30 represents a conductive layer to connect the light emitting unit to the light receiving unit, and 33 denotes a light sensor.

Figure 3:
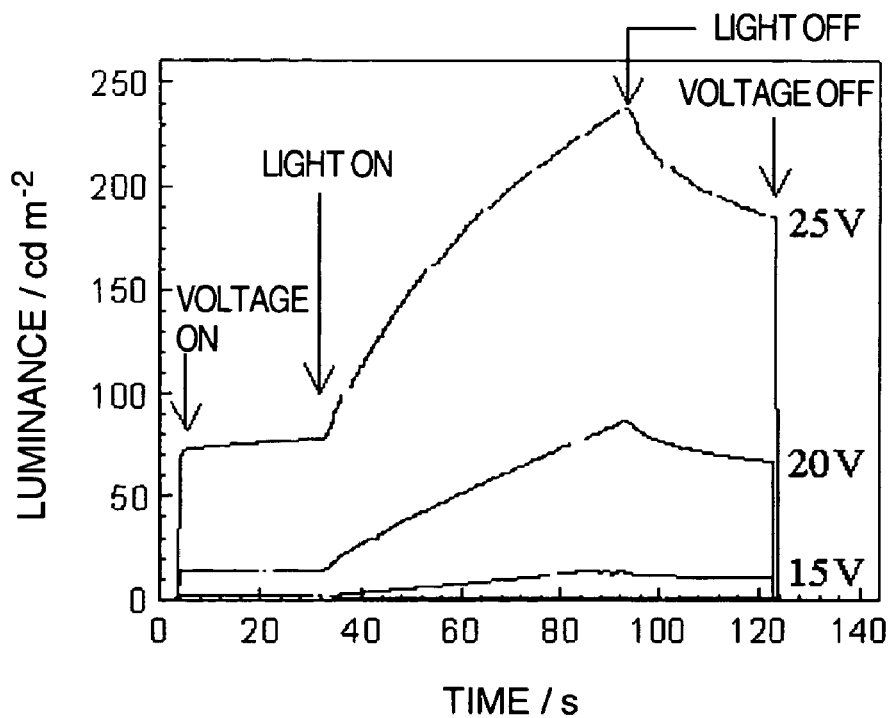
FIG. 3 is a graph showing change in the intensity of incident light by the outgoing light irradiation of a light-light conversion device of the example represented by FIG. 2.

FIG. 3 shows the results of the intensities of the outgoing light 29 in the case wherein the applied voltage Va was 5 to 30 V measured by a light sensor 33 using a photodiode. In the measurement, the radiation of incident light 28 was started 30 seconds after starting the application of the direct current source 27, and the radiation of incident light 28 was stopped 60 seconds after starting the radiation of incident light 28. The intensities of the outgoing light 29 were changed by the ON/OFF of the incident light 28.

Figure 4:
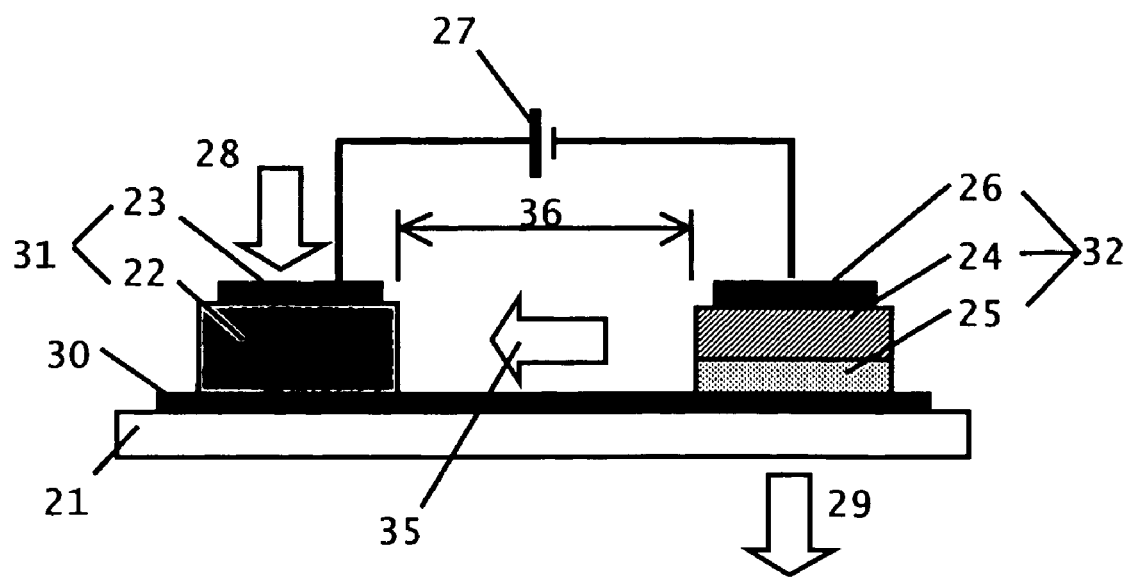
FIG. 4 is a diagram showing an example of the method for suppressing the light feedback effect by controlling the distance between the light sensing unit and the light emitting unit in a light-light conversion device of the present invention.
Figure 5:
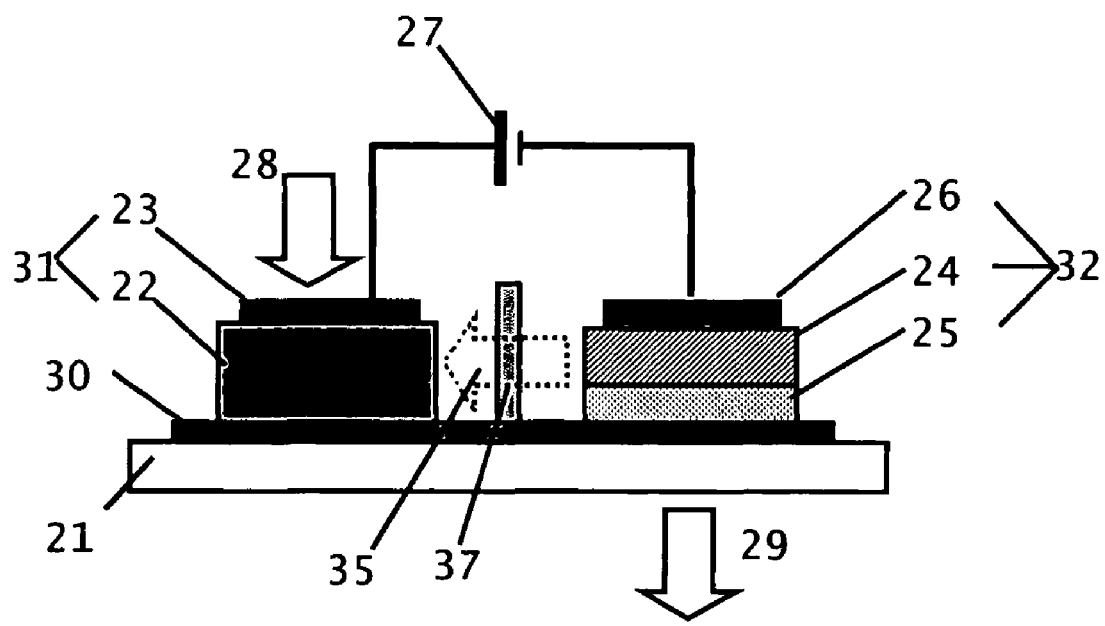
FIG. 5 is a diagram showing an example of the method for suppressing the light feedback effect by using a light shielding material in a light-light conversion device of the present invention.

From FIG. 3, it is known that the light emitting unit continues outputting light even after stopping the radiation of incident light. This is due to the above-described light feedback effect. In this example, no operations for suppressing the light feedback effect were performed in order to strengthen the intensity of the outgoing light. When importance is placed on the response to the incident light, the inflow of feedback light 35 into the light receiving unit 31 can be suppressed, for example, by the method of lengthening the distance 36 between the light receiving unit 31 and the light emitting unit 32 as FIG. 4 shows; or the method of installing a light-shielding member 37 between the light sensing unit 31 and the light emitting unit 32 as FIG. 5 shows.

Although the above-described light-shielding member 37 can completely shield the feedback light 35, when the effect of light amplification by light feedback is also desired to obtain, a member having a transmittance that suppresses but does not completely shield the flow of the feedback light into the light sensing unit (translucent member) can be used.

Next, the efficiency of light-light conversion from incident light to outgoing light will be described. This is defined by the value obtained by dividing the number of photons outputted as outgoing light by the number of photons inputted as incident light. If the value is less than 1, there is light loss during conversion; and if the value exceeds 1, the outgoing light more than incident light is obtained.

Figure 6:
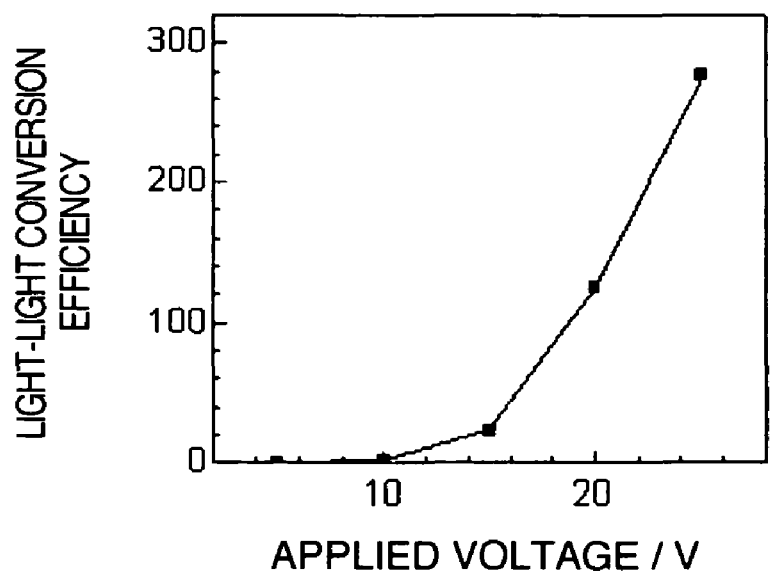
FIG. 6 is a graph showing light-light conversion efficiencies of a light-light conversion device of the example represented by FIG. 2.

The results are represented by FIG. 6. When Va is 25 V, 280 times light-light conversion efficiency was obtained.

EXAMPLE 2

<Fabrication of Organic Light-Light Conversion Device>

On a glass substrate with a patterned ITO film, the suspension of PEDOT is applied by an ink-jet method to form a thin PEDOT film on a part of the ITO film, and dried on a hot plate at 200° C. for 10 minutes. Decalin solutions of PFO and TFB are mixed in a weight ratio of 6:4, and filtered using a 0.2-μm filter. The filtered solution is applied onto the thin PEDOT film by an ink-jet method to form a light emitting unit region. Then, a thin polymer semiconductor film is formed on the area of the ITO film where no PEDOT film is formed by an ink-jet method using a decalin solution of PFO filtered by a 0.2-μm filter to form a light sensing unit region. The substrate is set in a vacuum vapor deposition apparatus, and an MgAg film having a thickness of 30 nm is formed as a cathode by co-deposition method at a speed of 5:0.5 angstroms/sec on the light emitting region using a shadow mask. An Ag film having a thickness of 20 nm is formed thereon at a speed of 0.6 angstroms/sec. The shadow mask is moved, and an Au film having a thickness of 20 nm is formed thereon as an electrode at a speed of 0.4 angstroms/sec.

<Characteristic Evaluation of Organic Light-Light Conversion Device>

In the same manner as in Example 1, incident light 28 of a wavelength of 400 nm and an intensity of 56 $\mu W/cm^2$ is radiated while applying voltage Va between the light receiving unit and the light emitting unit. As a result, outgoing light of a wavelength of 450 nm is obtained from the substrate side of the light emitting unit, and the wavelength is converted. The light-light conversion efficiency from incident light to outgoing light at this time exceeds 10 times, and light amplification can be confirmed.

INDUSTRIAL APPLICABILITY

The organic light-light conversion device of the present invention excels in device characteristics of light-light conversion efficiency, and can be used in an image intensifier, an optical sensor and the like.

The invention claimed is:
1. An organic light-light conversion device comprising:
a light sensing unit having a layer including a photo-conductive organic semiconductor that causes a photo-current multiplication phenomenon by light irradiation, and
a light emitting unit having a layer including an electroluminescent organic semiconductor that emits light by current injection, characterized in that
at least one of the photo-conductive organic semiconductor and the electroluminescent organic semiconductor is a polymer semiconductor having a conjugation in the main chain,
wherein the polymer semiconductor contains one or more repeating units represented by the following Formula (1):

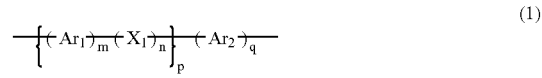

(1)

wherein $Ar_1$ and $Ar_2$ each independently represent an arylene group or a divalent heterocyclic group; $X_1$ represents —$CR_1$=$CR_2$—, —C≡C— or —$N(R_3)$—; $R_1$ and $R_2$ each independently represent a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group; m, n and q each independently represent an integer of 0 or 1; p represents an integer of 0 to 2; and m+n and p+q are each 1 or more, provided that $Ar_1$, $X_1$, $R_1$, $R_2$ and $R_3$, if they are each multiple, can be respectively identical or different, and has a polystyrene-converted number average molecular weight of $1 \times 10^3$ to $1 \times 10^8$.

2. The organic light-light conversion device according to claim 1, wherein the photo-conductive organic semiconductor is a polymer semiconductor.

3. The organic light-light conversion device according to claim 1, wherein the electroluminescent organic semiconductor is a polymer semiconductor.

4. The organic light-light conversion device according to claim 1, wherein the photo-conductive organic semiconductor and the electroluminescent organic semiconductor are polymer semiconductors.

5. The organic light-light conversion device according to claim 1, comprising:
   a) a light sensing unit having a layer including the photo-conductive organic semiconductor,
   b) a light emitting unit having a layer including the electroluminescent organic semiconductor placed on a different location from the light sensing unit on the same substrate, and
   c) a conductive layer connecting the light sensing unit to the light emitting unit laid on the same substrate.

6. The organic light-light conversion device according to claim 1, wherein the light sensing unit having a layer including the photo-conductive organic semiconductor is integrally laminated with the light emitting unit having a layer including the electroluminescent organic semiconductor.

7. The organic light-light conversion device according to claim 5, wherein a light shielding member is provided between the light sensing unit and light emitting unit.

8. The organic light-light conversion device according to claim 5, wherein a translucent member having a transmittance that suppresses but does not completely shield the flow of feedback light into the light sensing unit is provided between the light sensing unit and the light emitting unit.

9. An organic light-light conversion device comprising:
   a light sensing unit having a layer including a photo-conductive organic semiconductor that causes a photo-current multiplication phenomenon by light irradiation, and
   a light emitting unit having a layer including an electroluminescent organic semiconductor that emits light by current injection, characterized in that
   at least one of the photo-conductive organic semiconductor and the electroluminescent organic semiconductor is a polymer semiconductor having a conjugation in the main chain,
   wherein the layer including the photo-conductive organic semiconductor and/or the layer including the electroluminescent organic semiconductor contains two or more polymer semiconductors containing one or more repeating units represented by the following Formula (1):

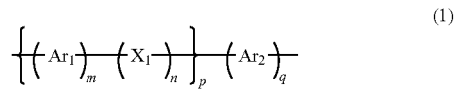

wherein $Ar_1$ and $Ar_2$ each independently represent an arylene group or a divalent heterocyclic group; $X_1$ represents —$CR_1$=$CR_2$—, or —$N(R_3)$—; $R_1$ and $R_2$ each independently represent a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group; m, n and q each independently represent an integer of 0 or 1; p represents an integer of 0 to 2; and m+n and p+q are each 1 or more, provided that $Ar_1$, $X_1$, $R_1$, $R_2$ and $R_3$, if they are each multiple, can be respectively identical or different, and has a polystyrene-converted number average molecular weight of $1 \times 10^3$ to $1 \times 10^8$.

10. The organic light-light conversion device according to claim 9, wherein the photo-conductive organic semiconductor is a polymer semiconductor.

11. The organic light-light conversion device according to claim 9, wherein the electroluminescent organic semiconductor is a polymer semiconductor.

12. The organic light-light conversion device according to claim 9, wherein the photo-conductive organic semiconductor and the electroluminescent organic semiconductor are polymer semiconductors.

13. The organic light-light conversion device according to claim 9, comprising:
   a) a light sensing unit having a layer including the photo-conductive organic semiconductor,
   b) a light emitting unit having a layer including the electroluminescent organic semiconductor placed on a different location from the light sensing unit on the same substrate, and
   c) a conductive layer connecting the light sensing unit to the light emitting unit laid on the same substrate.

14. The organic light-light conversion device according to claim 9, wherein the light sensing unit having a layer including the photo-conductive organic semiconductor is integrally laminated with the light emitting unit having a layer including the electroluminescent organic semiconductor.

15. The organic light-light conversion device according to claim 13, wherein a light shielding member is provided between the light sensing unit and light emitting unit.

16. The organic light-light conversion device according to claim 13, wherein a translucent member having a transmittance that suppresses but does not completely shield the flow of feedback light into the light sensing unit is provided between the light sensing unit and the light emitting unit.

17. An image intensifier characterized by comprising a plurality of an organic light-light conversion devices comprising:
   a light sensing unit having a layer including a photo-conductive organic semiconductor that causes a photo-current multiplication phenomenon by light irradiation, and
   a light emitting unit having a layer including an electroluminescent organic semiconductor that emits light by current injection, characterized in that
   at least one of the photo-conductive organic semiconductor and the electroluminescent organic semiconductor is a polymer semiconductor having a conjugation in the main chain, wherein the polymer semiconductor contains one or more repeating units represented by the following Formula (1):

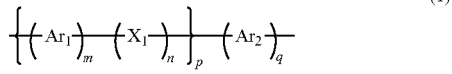

wherein $Ar_1$ and $Ar_2$ each independently represent an arylene group or a divalent heterocyclic group; $X_1$ represents —$CR_1$=$CR_2$—, —C≡C— or —N($R_3$)—; $R_1$ and $R_2$ each independently represent a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group; m, n and q each independently represent an integer of 0 or 1; p represents an integer of 0 to 2; and m+n and p+q are each 1 or more, provided that $Ar_1$, $X_1$, $R_1$, $R_2$ and $R_3$, if they are each multiple, can be respectively identical or different, and has a polystyrene-converted number average molecular weight of $1\times10^3$ to $1\times10^8$.

18. A light sensor characterized by comprising an organic light-light conversion device comprising:
   a light sensing unit having a layer including a photo-conductive organic semiconductor that causes a photo-current multiplication phenomenon by light irradiation, and
   a light emitting unit having a layer including an electroluminescent organic semiconductor that emits light by current injection, characterized in that
   at least one of the photo-conductive organic semiconductor and the electroluminescent organic semiconductor is a polymer semiconductor having a conjugation in the main chain, and
   a unit which measures and outputs a voltage applied to both ends of the layer including the electroluminescent organic semiconductor,
   wherein the polymer semiconductor contains one or more repeating units represented by the following Formula (1):

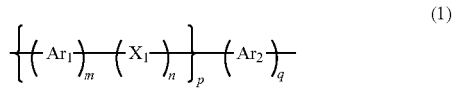

wherein $Ar_1$ and $Ar_2$ each independently represent an arylene group or a divalent heterocyclic group; $X_1$ represents —$CR_1$=$CR_2$—, —C≡C— or —N($R_3$)—; $R_1$ and $R_2$ each independently represent a hydrogen atom, an alkyl group, an aryl group, a monovalent heterocyclic group, a carboxyl group, a substituted carboxyl group or a cyano group; $R_3$ represents a hydrogen atom, an alkyl group, an aryl group, a monovalent heterocyclic group, an arylalkyl group or a substituted amino group; m, n and q each independently represent an integer of 0 or 1; p represents an integer of 0 to 2; and m+n and p+q are each 1 or more, provided that $Ar_1$, $X_1$, $R_1$, $R_2$ and $R_3$, if they are each multiple, can be respectively identical or different, and has a polystyrene-converted number average molecular weight of $1\times10^3$ to $1\times10^8$.

* * * * *